(12) United States Patent
Hanazono et al.

(10) Patent No.: US 9,366,815 B2
(45) Date of Patent: Jun. 14, 2016

(54) OPTO-ELECTRIC HYBRID BOARD

(71) Applicant: NITTO DENKO CORPORATION, Ibaraki-shi, Osaka (JP)

(72) Inventors: Hiroyuki Hanazono, Ibaraki (JP); Yuichi Tsujita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 197 days.

(21) Appl. No.: 13/897,574

(22) Filed: May 20, 2013

(65) Prior Publication Data

US 2014/0016896 A1 Jan. 16, 2014

(30) Foreign Application Priority Data

Jul. 13, 2012 (JP) ................................. 2012-157828

(51) Int. Cl.
| G02B 6/43 | (2006.01) |
| G02B 6/12 | (2006.01) |
| H05K 1/02 | (2006.01) |
| G02B 6/122 | (2006.01) |

(52) U.S. Cl.
CPC *G02B 6/12* (2013.01); *G02B 6/122* (2013.01); *G02B 6/43* (2013.01); *H05K 1/0274* (2013.01)

(58) Field of Classification Search
CPC .................................. H05K 1/18; H05K 1/16
See application file for complete search history.

(56) References Cited

U.S. PATENT DOCUMENTS

2003/0068523 A1* 4/2003 Kaneta .................. B32B 15/018
428/670

2008/0236876 A1* 10/2008 Kodama .................... G02B 6/43
174/260
2009/0269704 A1 10/2009 Hodono
2011/0116737 A1 5/2011 Kim et al.

FOREIGN PATENT DOCUMENTS

| JP | 09-155442 A | 6/1997 |
| JP | 2005-297018 A | 10/2005 |
| JP | 2009-265342 A | 11/2009 |
| JP | 2010-266598 A | 11/2010 |
| JP | 2011-048150 A | 3/2011 |

OTHER PUBLICATIONS

Cobalt (Co) material information, http://www.goodfellow.com/E/Cobalt.html, accessed Nov. 2015.*
Nickel (Ni) material information, http://www.goodfellow.com/E/Nickel.html, accessed Nov. 2015.*
Extended European Search Report dated Oct. 24, 2013, issued in corresponding European Patent Application No. 13170836.4 (4 pages).
Japanese Office Action dated Dec. 15, 2015, issued in corresponding JP Application No. 2012-157828 (6 pages). With English translation.

* cited by examiner

*Primary Examiner* — Michelle R Connelly
*Assistant Examiner* — Hoang Tran
(74) *Attorney, Agent, or Firm* — Westerman, Hattori, Daniels & Adrian, LLP

(57) ABSTRACT

An opto-electric hybrid board which is excellent in the mountability of an optical element and in flexibility is provided. The opto-electric hybrid board includes an electric circuit board, an optical waveguide, and metal layers. The electric circuit board includes an insulative layer having front and back surfaces, and optical element mounting pads formed on the front surface of the insulative layer. The optical waveguide includes a first cladding layer, and is formed on the back surface of the insulative layer of the electric circuit board in such a manner that the first cladding layer is in contact with the back surface of the insulative layer. The metal layers are provided between the insulative layer and the first cladding layer and disposed in corresponding relation to the optical element mounting pads.

2 Claims, 5 Drawing Sheets

RELATED ART

OPTO-ELECTRIC HYBRID BOARD

BACKGROUND OF THE INVENTION

1. Field of the Invention

The present invention relates to an opto-electric hybrid board including an optical waveguide and an electric circuit board which are stacked together.

2. Description of the Related Art

With the increase in the amount of transmission information, optical interconnection in addition to electrical interconnection has been used in recent electronic devices and the like. As an example of such a technique, an opto-electric hybrid board has been disclosed in Japanese Laid-open Patent Application Publication No. 2011-48150. As shown in FIG. 6, this opto-electric hybrid board includes: a flexible circuit board $E_0$ including a flexible substrate 51, and electrical interconnect lines 52 formed on the front surface of the flexible substrate 51; and an optical waveguide (optical interconnect lines) $W_0$ (including an under cladding layer 56, a core 57 and an over cladding layer 58) made of epoxy resin and the like and stacked on the back surface (a surface opposite from the surface with the electrical interconnect lines 52 formed thereon) of the flexible substrate 51 of the flexible circuit board $E_0$.

However, when an optical element is mounted on the flexible circuit board $E_0$ of the aforementioned opto-electric hybrid board, both the flexible circuit board $E_0$ and the optical waveguide $W_0$, which are thin and flexible, are deformed by the load applied during the mounting process. This makes the mounting process difficult, resulting in poor workability during the mounting process. Additionally, there is a danger that light propagation losses are increased due to the aforementioned deformation.

Another opto-electric hybrid board, on the other hand, has been disclosed in Japanese Laid-open Patent Application Publication No. 2009-265342. As shown in FIG. 7, this opto-electric hybrid board includes a stainless steel layer $M_0$ provided entirely between the flexible circuit board $E_0$ and the optical waveguide $W_0$. In this opto-electric hybrid board, the stainless steel layer $M_0$ serves as a reinforcement to suppress the deformation resulting from the load applied during the process of mounting the optical element. Thus, this opto-electric hybrid board is excellent in the mountability of the optical element, and is small in light propagation losses due to the aforementioned deformation.

Recently, there has been a need for the size reduction of the aforementioned electronic devices and the like. Accordingly, a need has arisen for the use of such an opto-electric hybrid board in a small space. For such needs, it is necessary that the opto-electric hybrid board is made flexible and stored in a small space. In the opto-electric hybrid board including the stainless steel layer $M_0$ provided entirely as mentioned above (with reference to FIG. 7), the stainless steel layer $M_0$, however, acts as an impediment to making the opto-electric hybrid board flexible. Such a conventional opto-electric hybrid board still has room for improvement in this regard.

SUMMARY OF THE INVENTION

An opto-electric hybrid board which is excellent in the mountability of an optical element and in flexibility is provided.

The opto-electric hybrid board comprises: an electric circuit board including an insulative layer having front and back surfaces, and an optical element mounting pad formed on the front surface of the insulative layer; an optical waveguide including a cladding layer, the optical waveguide being formed on the back surface of the insulative layer of the electric circuit board in such a manner that the cladding layer is in contact with the back surface of the insulative layer; and a metal layer provided between the insulative layer and the cladding layer and disposed in corresponding relation to the optical element mounting pad, the metal layer having a yield stress or 0.2% proof stress of not less than 170 MPa and a thickness in the range of 10 to 25 μm.

In the opto-electric hybrid board, the metal layer is not entirely provided but is disposed in corresponding relation to the optical element mounting pad. Thus, the opto-electric hybrid board is excellent in flexibility. Further, the metal layer has a yield stress or 0.2% proof stress of not less than 170 MPa, and a thickness in the range of 10 to 25 μm. Thus, the opto-electric hybrid board achieves the reduction in thickness and suppresses the deformation of the electric circuit board and the optical waveguide during the process of mounting the optical element on the optical element mounting pad, to provide the excellent mountability of the optical element. The suppression of the aforementioned deformation reduces light propagation losses resulting from the deformation.

Preferably, the metal layer is made of a material which is stainless steel. In such a case, the opto-electric hybrid board is excellent in resistance to thermal expansion and contraction to provide high quality reliability.

DETAILED DESCRIPTION OF THE INVENTION

Preferred embodiments according to the present invention will now be described in detail with reference to the drawings.

Figure 1A:
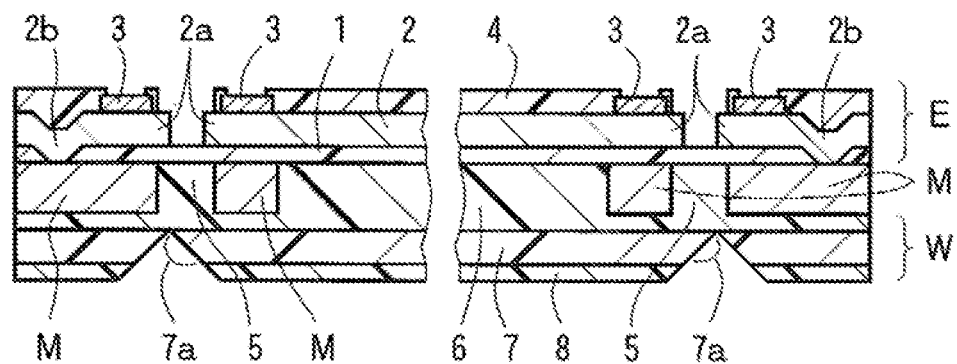
FIG. 1A is a longitudinal sectional view schematically showing an opto-electric hybrid board according to a first preferred embodiment.
Figure 1B:
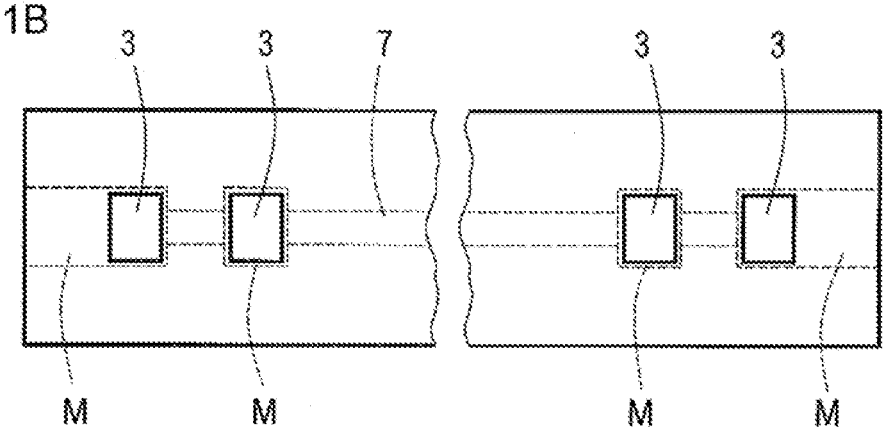
FIG. 1B is a plan view of the opto-electric hybrid board.

FIG. 1A is a longitudinal sectional view schematically showing an opto-electric hybrid board according to a first preferred embodiment. FIG. 1B is a plan view of the opto-electric hybrid board. In FIG. 1B, only some components including optical element mounting pads 3, metal layers M, a core 7 and the like are illustrated for the sake of definiteness of the arrangement of the optical element mounting pads 3 and the metal layers M in the opto-electric hybrid board. The opto-electric hybrid board according to the first preferred embodiment includes: an electric circuit board E including a transparent insulative layer 1 having front and back surfaces, electrical interconnect lines 2 formed on the front surface of the insulative layer 1, and the optical element mounting pads 3 formed on the electrical interconnect lines 2; and an optical waveguide W including a first cladding layer (under cladding layer) 6 and formed on the back surface of the insulative layer 1 of the electric circuit board E in such a manner that the first cladding layer 6 is in contact with the back surface of the insulative layer 1. The entire opto-electric hybrid board is strip-shaped. The metal layers M are provided between the insulative layer 1 and the first cladding layer 6 and disposed in corresponding relation to the optical element mounting pads 3. The metal layers M have a yield stress or 0.2% proof stress of not less than 170 MPa, and a thickness in the range of 10 to 25 μm.

In each longitudinal end portion of the strip-shaped opto-electric hybrid board according to the first preferred embodiment, two optical element mounting pads 3 are arranged in the longitudinal direction of the opto-electric hybrid board, and two metal layers M are arranged in the longitudinal direction of the opto-electric hybrid board in corresponding relation to the two optical element mounting pads 3. An outer one of the two metal layers M which is closer to each end of the opto-electric hybrid board extends toward each end thereof which of little concern in the flexibility of the opto-electric hybrid board, and a grounding electrode portion 2b included in the electrical interconnect lines 2 is in contact with the extension of the outer metal layer M. Between the aforementioned two metal layers M is an optical path portion 5 extending between an optical element mounted on the aforementioned two optical element mounting pads 3 and a light reflecting surface 7a (an inclined surface at 45 degrees) of the core 7.

In the opto-electric hybrid board, a metal layer is not entirely provided but the metal layers M are disposed in limited areas corresponding to the optical element mounting pads 3. Thus, a greater part of the opto-electric hybrid board where the metal layers M are absent is excellent in flexibility and is reduced in weight. Further, the metal layers M have a yield stress or 0.2% proof stress of not less than 170 MPa, and a thickness in the range of 10 to 25 μm. Thus, the opto-electric hybrid board achieves the reduction in thickness and suppresses the deformation of the electric circuit board E and the optical waveguide W during the process of mounting the optical element on the optical element mounting pads 3 to provide the excellent mountability of the optical element.

The metal layers M also have the function of blocking water or moisture which degrades light propagation efficiency from penetrating into the optical path portions 5 through side surfaces of the opposite ends (left-hand and right-hand end surfaces shown in FIGS. 1A and 1B) of the first cladding layer 6. Thus, the opto-electric hybrid board is capable of preventing the degradation of the light propagation efficiency due to the penetration of water or moisture into the optical path portions 5 as well as achieving flexibility, weight reduction and thickness reduction.

More specifically, the electric circuit board E includes the transparent insulative layer 1, and the electrical interconnect lines 2 formed on the front surface of the insulative layer 1, as stated above. The electrical interconnect lines 2 include optical element mounting portions 2a on which the optical element mounting pads 3 are formed, and the grounding electrode portions 2b extending through the insulative layer 1 into contact with the metal layers M on the back surface of the insulative layer 1. The optical element mounting pads 3 are uncovered, and the electrical interconnect lines 2 are covered with a coverlay 4 and are insulated and protected.

In each longitudinal end portion of the opto-electric hybrid board, the metal layers M are provided between the insulative layer 1 and the first cladding layer 6 and disposed in corresponding relation to the two optical element mounting pads 3, as stated above. From the viewpoints of achieving the reduction in the thickness of the opto-electric hybrid board and suppressing the deformation of the electric circuit board E and the optical waveguide W during the process of mounting the optical element on the optical element mounting pads 3, the metal layers M have a yield stress or 0.2% proof stress of not less than 170 MPa, and a thickness in the range of 10 to 25 μm. When the thickness of the metal layers M is less than 10 μm, further reduction in the thickness of the opto-electric hybrid board is achieved, but the deformation of the electric circuit board E and the optical waveguide W during the process of mounting the optical element is insufficiently suppressed. This gives rise to the reduction in mounting strength and the reduction in the positioning accuracy of the optical element. On the other hand, when the thickness of the metal layers M is greater than 25 μm, the aforementioned deformation is sufficiently suppressed, but the first cladding layer 6 is formed so as to cover the metal layers M, thereby becoming thick. This results in the insufficient flexibility of the opto-electric hybrid board.

The optical waveguide W includes the first cladding layer (under cladding layer) 6, the core 7 formed in a predetermined pattern on the front surface of the first cladding layer 6, and a second cladding layer (over cladding layer) 8 formed on the front surface of the first cladding layer 6 so as to cover the core 7. The first cladding layer 6 covers the metal layers M, and enters and fills the optical path portions 5. The first cladding layer 6 has a back surface (a surface opposite from the surface with the core 7 formed thereon) in contact with the insulative layer 1 of the electric circuit board E. In the opposite longitudinal end portions of the optical waveguide W, portions of the core 7 corresponding to the optical path portions 5 are in the form of inclined surfaces at 45 degrees with respect to the longitudinal direction of the core 7. The inclined surfaces serve as the light reflecting surfaces 7a capable of reflecting light beams to propagate light beams between the optical element mounted on the optical element mounting pads 3 and the core 7. At the light reflecting surfaces 7a, the refractive index of the core 7 is higher than that of air present outside the light reflecting surfaces 7a. For this reason, when light beams coming from a light-emitting element (an optical element) and propagated through the core 7 impinge upon the light reflecting surfaces 7a, a majority of the light beams are reflected from the light reflecting surfaces 7a to change the optical path thereof by 90 degrees.

The optical path portions 5, which are formed in the first cladding layer 6 made of resins such as epoxy resins, are hygroscopic. The light propagation efficiency in the optical path portions 5 is degraded, if the moisture in the outside air penetrates through the outer peripheral side surfaces of the first cladding layer 6 into the optical path portions 5, for example, after use in high-humidity environments or after prolonged use to result in an excessive amount of moisture absorption in part of the optical path portions 5 corresponding to the first cladding layer 6. The metal layers M according to the first preferred embodiment prevent water or moisture from penetrating into the optical path portions 5, as stated above.

Next, a method of manufacturing the opto-electric hybrid board will be described (with reference to FIGS. 2A to 2E and FIGS. 3A to 3D).

First, a metal sheet material $M_1$ (with reference to FIG. 2A) for the formation of the metal layers M is prepared. Examples of a metal material for the metal sheet material $M_1$ (the metal layers M) include stainless steel, titanium, and various alloys having a yield stress or 0.2% proof stress of not less than 170 MPa. The metal sheet material $M_1$ has a thickness in the range of 10 to 25 μm which is approximately equal to the thickness of the metal layers M.

Figure 2A:
FIGS. 2A to 2E are illustrations schematically showing the steps of producing an electrical circuit board and producing metal layers in a method of manufacturing the opto-electric hybrid board.

Next, as shown in FIG. 2A, a photosensitive insulating resin including a polyimide resin and the like is applied to the front surface of the metal sheet material $M_1$ to form the insulative layer 1 having a predetermined pattern by a photolithographic process. In the first preferred embodiment, holes 1a which uncover front surface portions of the metal sheet material $M_1$ corresponding to the grounding electrode portions 2b are formed in the opposite longitudinal end portions, respectively, of the insulative layer 1 for the purpose of forming the grounding electrode portions 2b for contact with the metal layers M (metal sheet material $M_1$). The insulative layer 1 has a thickness in the range of 3 to 40 μm.

Figure 2B:
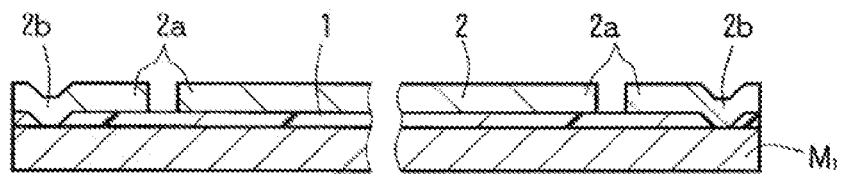

Next, as shown in FIG. 2B, the electrical interconnect lines 2 (including the optical element mounting portions 2a and the grounding electrode portions 2b) are formed by a semi-additive process, for example. The semi-additive process is as follows. First, a metal film (not shown) made of copper, chromium and the like is formed on the front surface of the insulative layer 1 by sputtering, electroless plating or the like. This metal film serves as a seed layer (a layer serving as a basis material for the formation of an electroplated layer) for a subsequent electroplating process. Then, a photosensitive resist (not shown) is laminated to the opposite surfaces of a laminate comprised of the metal sheet material $M_1$, the insulative layer 1, and the seed layer. Thereafter, a photolithographic process is performed to form holes having the pattern of the electrical interconnect lines 2 in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer are the electrical interconnect lines 2. The electrical interconnect lines 2 have a thickness in the range of 5 to 35 μm.

Figure 2C:
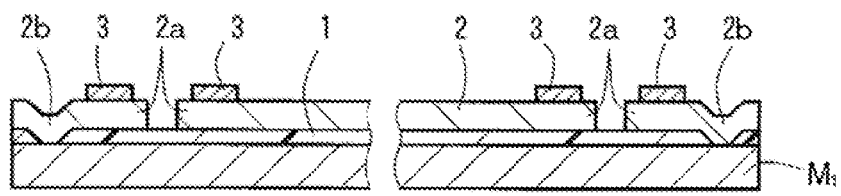

Then, the resultant structure except the optical element mounting portions 2a is masked. An electroplated layer made of gold, nickel and the like is formed on the front surface of the optical element mounting portions 2a to form the optical element mounting pads 3, as shown in FIG. 2C. Thereafter, the mask is removed.

Figure 2D:
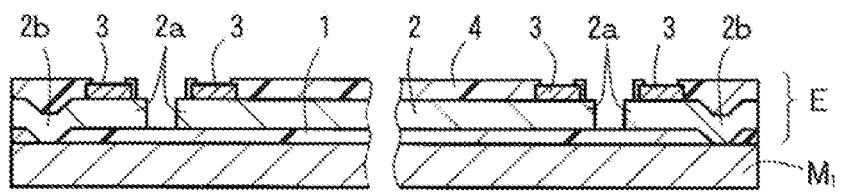

Then, as shown in FIG. 2D, a photosensitive insulating resin including a polyimide resin and the like is applied to a portion of the electrical interconnect lines 2 so that the optical element mounting pads 3 are uncovered, to thereby form the coverlay 4 by a photolithographic process. The coverlay 4 has a thickness in the range of 3 to 40 μm. In this manner, the electric circuit board E is formed on the front surface of the metal sheet material $M_1$.

Next, a photosensitive resist (not shown) is laminated to the opposite surfaces of a laminate comprised of the metal sheet material $M_1$ and the electric circuit board E. Thereafter, holes are formed by a photolithographic process in portions of the photosensitive resist on the back surface (the surface opposite from the electric circuit board E) of the metal sheet material $M_1$ which correspond to portions other than the metal layers M, so that back surface portions of the metal sheet material $M_1$ are uncovered at the bottoms (the top surfaces as seen in the figure) of the holes.

Figure 2E:
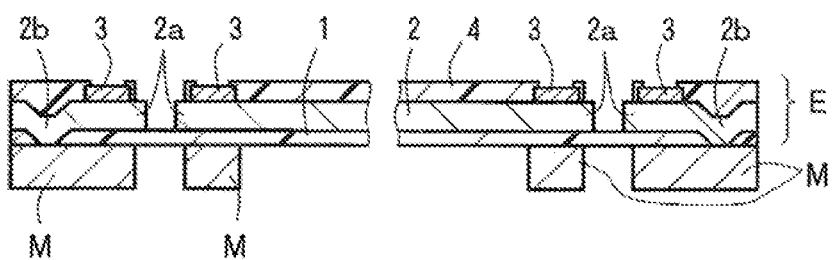

Then, as shown in FIG. 2E, the portions of the metal sheet material $M_1$ uncovered at the bottoms of the holes are removed by etching using an aqueous etching solution for the metal material of the metal sheet material $M_1$ (for example, an aqueous ferric chloride solution for a stainless steel layer). This forms the metal layers M, so that the insulative layer 1 is uncovered at the bottoms (the top surfaces as seen in the figure) of sites where the portions of the metal sheet material $M_1$ are removed. Thereafter, the photosensitive resist is stripped away using an aqueous sodium hydroxide solution and the like.

Figure 3A:
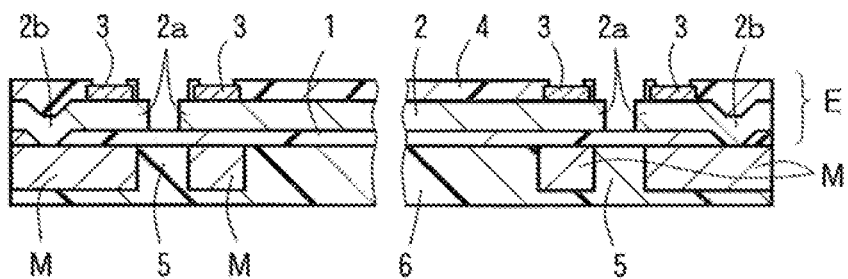
FIGS. 3A to 3D are illustrations schematically showing the steps of producing an optical waveguide in the method of manufacturing the opto-electric hybrid board.

For the formation of the optical waveguide W (with reference to FIG. 3D) on the back surface (the lower surface as seen in the figure) of the electric circuit board E, a photosensitive resin such as a photosensitive epoxy resin which is a material for the formation of the first cladding layer (under cladding layer) 6 is applied to the back surface of the insulative layer 1 so as to cover the metal layers M, as shown in FIG. 3A. Thereafter, the applied layer is exposed to irradiation light. This exposure cures the applied layer to form the first cladding layer 6. The first cladding layer 6 has a thickness (as measured from the back surface of the metal layers M) in the range of 5 to 60 μm. It should be noted that the back surface of the metal layers M is positioned to face upward when the optical waveguide W is formed (when the aforementioned first cladding layer 6, the core 7 to be described later and the second cladding layer 8 to be described later are formed).

Figure 3B:
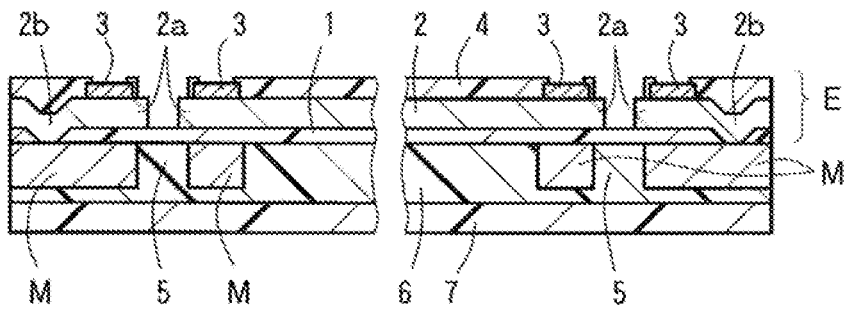

Then, as shown in FIG. 3B, the core 7 having a predetermined pattern is formed on the front surface (the lower surface as seen in the figure) of the first cladding layer 6 by a photolithographic process. The core 7 has a thickness in the range of 20 to 200 μm, and a width in the range of 20 to 200 μm. An example of a material for the formation of the core 7 includes a photosensitive resin similar to that for the first cladding layer 6, and the material used herein has a refractive index higher than that of the material for the formation of the aforementioned first cladding layer 6 and the second cladding layer 8 to be described below (with reference to FIG. 3C). The adjustment of the refractive index may be made, for example, by adjusting the selection of the types of the materials for the formation of the first cladding layer 6, the core 7 and the second cladding layer 8, and the composition ratio thereof.

Figure 3C:
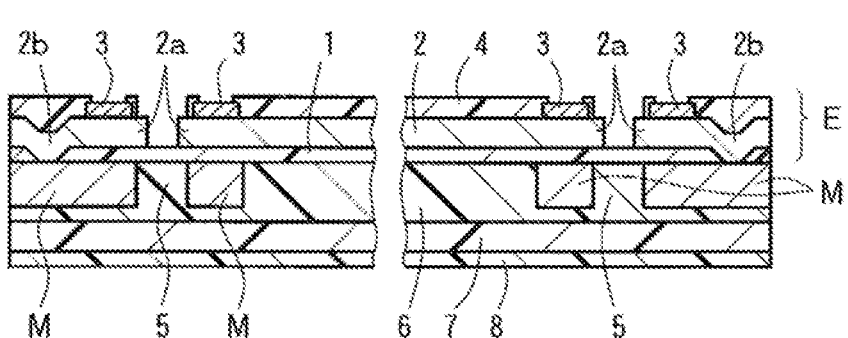

Next, as shown in FIG. 3C, the second cladding layer 8 is formed on the front surface (the lower surface as seen in the figure) of the first cladding layer 6 by a photolithographic process so as to cover the core 7. The second cladding layer 8 has a thickness (as measured from the front surface of the first cladding layer 6) not less than that of the core 7 and not greater than 400 μm. An example of a material for the formation of the second cladding layer 8 includes a photosensitive resin similar to that for the first cladding layer 6.

Figure 3D:
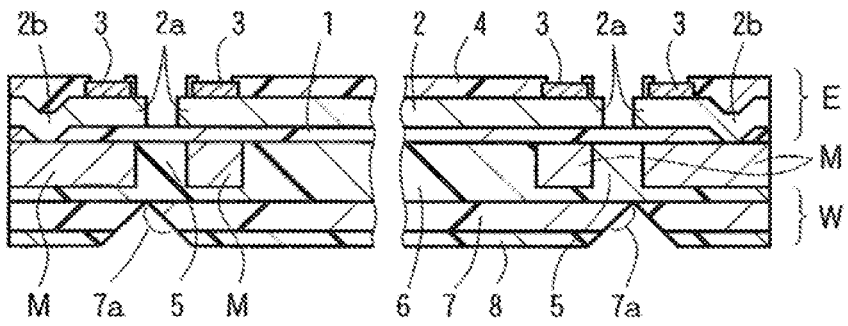

Then, as shown in FIG. 3D, portions (opposite end portions) of the optical waveguide W (positioned in a lower part in the figure) corresponding to the optical path portions 5 are formed into inclined surfaces inclined at 45 degrees with respect to the longitudinal direction of the core 7 by laser beam machining, cutting using a rotary blade and the like having an included angle of 90 degrees, and the like. Portions of the core 7 positioned at the inclined surfaces function as the light reflecting surfaces 7a. In this manner, the optical waveguide W is formed on the back surface of the electric circuit board E. This provides the opto-electric hybrid board shown in FIGS. 1A and 1B.

Figure 4:
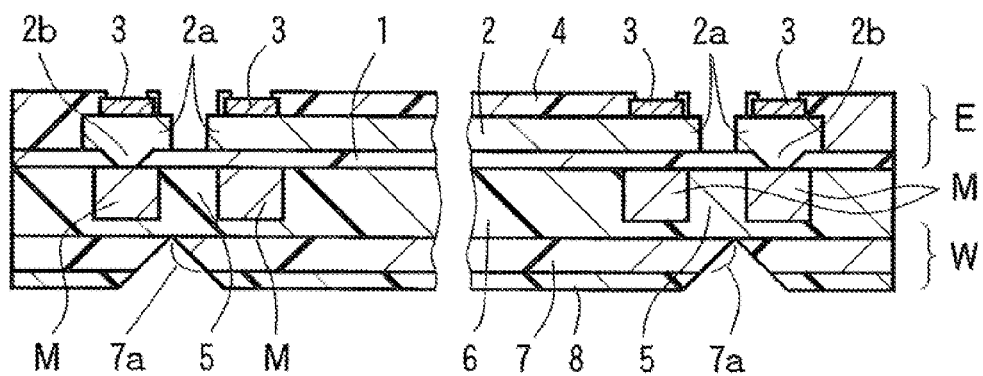
FIG. 4 is a longitudinal sectional view schematically showing an opto-electric hybrid board according to a second preferred embodiment.

FIG. 4 is a longitudinal sectional view schematically showing an opto-electric hybrid board according to a second preferred embodiment. The opto-electric hybrid board according to the second preferred embodiment is configured such that the outer metal layers M which are closer to the opposite ends of the opto-electric hybrid board in the first preferred embodiment shown in FIGS. 1A and 1B do not extend toward the opposite ends, and such that the grounding electrode portions 2b of the electrical interconnect lines 2 are formed under the optical element mounting pads 3 and are in contact with the outer metal layers M. Other parts of the second preferred embodiment are similar to those of the first preferred embodiment shown in FIGS. 1A and 1B. Like reference numerals and characters are used to designate parts similar to those of the first preferred embodiment.

In the opto-electric hybrid board according to the second preferred embodiment, the outer metal layers M do not extend toward the opposite ends of the opto-electric hybrid board. Thus, the opposite end portions of the opto-electric hybrid board are also flexible.

Figure 5:
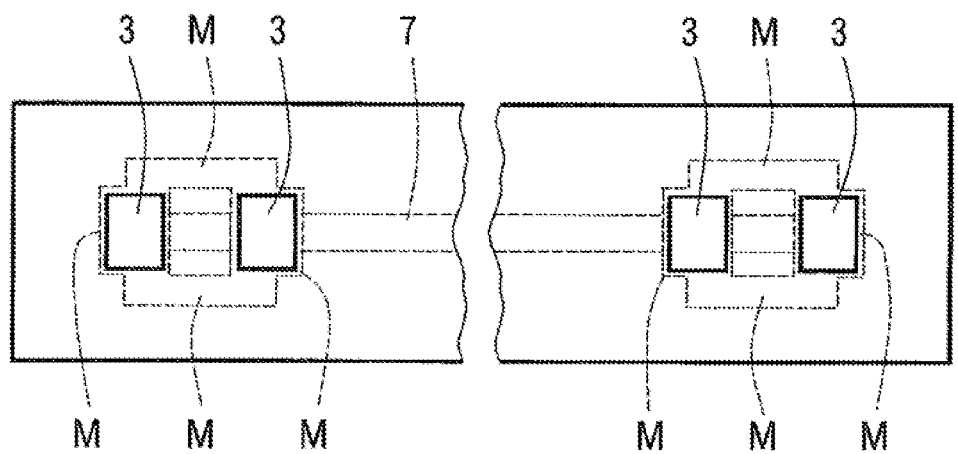
FIG. 5 is a plan view schematically showing an opto-electric hybrid board according to a third preferred embodiment.
Figure 6:
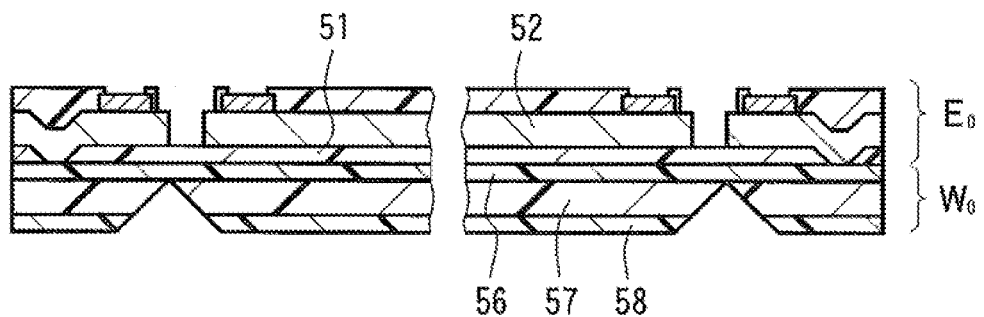
FIG. 6 is a longitudinal sectional view schematically showing a conventional opto-electric hybrid board.
Figure 7:
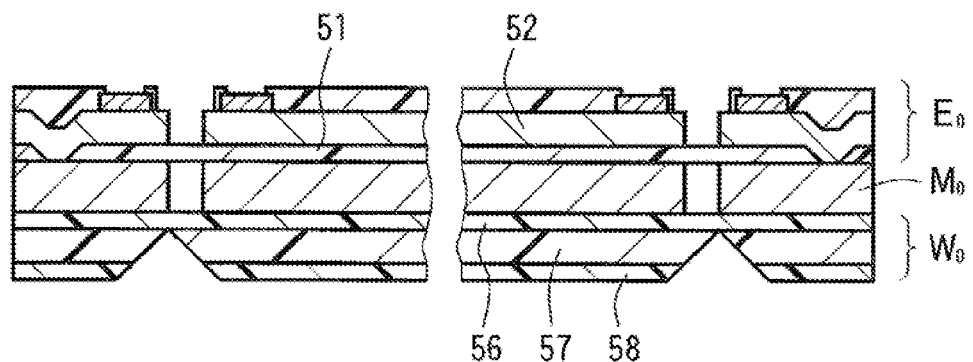
FIG. 7 is a longitudinal sectional view schematically showing another conventional opto-electric hybrid board.

FIG. 5 is a plan view schematically showing an opto-electric hybrid board according to a third preferred embodiment. The opto-electric hybrid board according to the third preferred embodiment is configured such that, in each longitudinal end portion of the opto-electric hybrid board in the second preferred embodiment shown in FIG. 4, two additional metal layers M are disposed in the transverse direction of the opto-electric hybrid board, so that the two additional metal layers M and the two metal layers M of the second preferred embodiment disposed in the longitudinal direction are in the form of a rectangular frame to surround each of the optical path portions 5. Other parts of the third preferred embodiment are similar to those of the second preferred embodiment shown in FIG. 4. Like reference numerals and characters are used to designate parts similar to those of the second preferred embodiment. In FIG. 5, only some components including the optical element mounting pads 3, the metal layers M, the core 7 and the like are illustrated for the sake of definiteness of the arrangement of the optical element mounting pads 3 and the metal layers M in the opto-electric hybrid board.

In the third preferred embodiment, the metal layers M are in the form of a rectangular frame near the optical element mounting pads 3. The metal layers M in the form of a rectangular frame are high in rigidity. This further suppresses the deformation of the electric circuit board E and the optical waveguide W during the process of mounting the optical element on the optical element mounting pads 3 to provide the more excellent mountability of the optical element.

The optical path portions 5, which are formed in the first cladding layer 6 made of a photosensitive resin such as a photosensitive epoxy resin, are hygroscopic, as stated above. The light propagation efficiency in the optical path portions 5 is degraded, if the moisture in the outside air penetrates through the outer peripheral side surfaces of the first cladding layer 6 into the optical path portions 5, for example, after use in high-humidity environments or after prolonged use to result in an excessive amount of moisture absorption in part of the optical path portions 5 corresponding to the first cladding layer 6. In the third preferred embodiment, on the other hand, the metal layers M in the form of a rectangular frame surround each of the optical path portions 5 to prevent the moisture from penetrating into each of the optical path portions 5 substantially completely. Thus, the opto-electric hybrid board according to the third preferred embodiment maintains high light propagation efficiency for a long time.

Next, inventive examples of the present invention will be described in conjunction with comparative examples. It should be noted that the present invention is not limited to the inventive examples.

EXAMPLES

Inventive Examples 1 to 3 and Comparative Examples 1 to 4

The type and thickness of metal layers and the thickness of a first cladding layer (under cladding layer) (as measured from an insulative layer) in the first preferred embodiment were those listed in Table 1 below. Each opto-electric hybrid board had a length of 100 mm, and a width of 30 mm. The insulative layer had a thickness of 5 μm. A core had a thickness of 50 μm, and a width of 50 μm. A second cladding layer (over cladding layer) had a thickness of 60 μm (as measured from the front surface of the first cladding layer).

<Mountability of Optical Element>

A flip chip bonder was used to mount a light-emitting element (ULM850-05-TT-C0101D available from U-L-M photonics GmbH) on optical element mounting pads of each of the opto-electric hybrid boards in Inventive Examples 1 to 3 and Comparative Examples 1 to 4. Then, the amount of deformation of the optical element mounting pads after the mounting process was measured with an electron microscope. The results were listed in Table 1 below in which an opto-electric hybrid board having the amount of deformation of not greater than 5 μm was evaluated as being excellent in mountability and indicated by an open circle, and an opto-electric hybrid board having the amount of deformation of greater than 5 μm was evaluated as being poor in mountability and indicated by a cross.

<Flexibility>

Each of the opto-electric hybrid boards in Inventive Examples 1 to 3 and Comparative Examples 1 to 4 was bent several times in the longitudinal and transverse directions. The results were listed in Table 1 below in which an opto-electric hybrid board that was easy to bend was indicated by an open circle, and an opto-electric hybrid board that was difficult to bend was indicated by a cross.

TABLE 1

| | | Inventive Examples | | | Comparative Examples | | | |
|---|---|---|---|---|---|---|---|---|
| | | 1 | 2 | 3 | 1 | 2 | 3 | 4 |
| Metal Layers | Material | SUS304 | | SUS316L | No | SUS304 | | Cu |
| | 0.2% Proof Stress (MPa) | 210 | | 175 | | 210 | | 130 |
| | Thickness (μm) | 10 | 25 | 25 | | 5 | 30 | 20 |
| Thickness of Under Cladding Layer (μm) | | 15 | 30 | 30 | 15 | 10 | 35 | 25 |
| Mountability | | ○ | ○ | ○ | x | x | ○ | x |
| Flexibility | | ○ | ○ | ○ | ○ | ○ | x | ○ |

SUS304 and SUS316L: Types of Stainless Steel

The results in Table 1 show that Inventive Examples 1 to 3 in which the metal layers have a 0.2% proof stress of not less than 170 MPa and a thickness in the range of 10 to 25 μm are excellent in the mountability of the optical element and in flexibility, and that Comparative Examples 1 to 4 in which the 0.2% proof stress and thickness of the metal layers fall outside the aforementioned ranges are poor in the mountability of the optical element or in flexibility.

The opto-electric hybrid board according to the present invention is usable in a small space within an electronic device.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

What is claimed is:

1. An opto-electric hybrid board comprising:
   an electric circuit board including an insulative layer having front and back surfaces, and an optical element mounting pad formed on the front surface of the insulative layer;
   an optical waveguide including a cladding layer, the optical waveguide being formed on the back surface of the insulative layer of the electric circuit board in such a manner that the cladding layer is in contact with the back surface of the insulative layer; and
   a metal layer provided between the insulative layer and the cladding layer and disposed in corresponding relation to the optical element mounting pad,
   wherein the metal layer has a yield stress of not less than 170 MPa or 0.2% proof stress of not less than 170 MPa, and
   wherein the metal layer has a thickness in the range of 10 to 25 μm.

2. The opto-electric hybrid board according to claim 1, wherein the metal layer is made of a material which is stainless steel.

* * * * *